United States Patent
Martinez et al.

(10) Patent No.: US 9,862,561 B2
(45) Date of Patent: Jan. 9, 2018

(54) DRIVING BOARD FOLDING MACHINE AND METHOD OF USING A DRIVING BOARD FOLDING MACHINE TO FOLD A FLEXIBLE CIRCUIT

(71) Applicant: Flextronics AP, LLC, Broomfield, CO (US)

(72) Inventors: Juan Jose Montiel Martinez, Jalisco (MX); Guillermo Armando Martinez Cruz, Jalisco (MX); Mario Lopez Ruiz, Jalisco (MX)

(73) Assignee: Flextronics AP, LLC, Broomfield, CO (US)

( * ) Notice: Subject to any disclaimer, the term of this patent is extended or adjusted under 35 U.S.C. 154(b) by 482 days.

(21) Appl. No.: 14/094,557

(22) Filed: Dec. 2, 2013

(65) Prior Publication Data

US 2014/0150252 A1   Jun. 5, 2014

Related U.S. Application Data

(60) Provisional application No. 61/732,812, filed on Dec. 3, 2012.

(51) Int. Cl.
 *B23P 19/00* (2006.01)
 *B65H 37/06* (2006.01)
 *H05K 1/18* (2006.01)

(52) U.S. Cl.
 CPC ............ *B65H 37/06* (2013.01); *H05K 1/189* (2013.01); *H05K 2201/051* (2013.01); *H05K 2201/10106* (2013.01); *Y10T 29/49124* (2015.01); *Y10T 29/532* (2015.01)

(58) Field of Classification Search
 CPC .. B65H 37/06; H05K 1/189; H05K 2201/055; H05K 2201/056
 USPC .................................................. 29/745, 829
 See application file for complete search history.

(56) References Cited

U.S. PATENT DOCUMENTS

| | | | |
|---|---|---|---|
| 2,911,605 A | 11/1959 | Wales, Jr. | |
| 4,051,425 A | 9/1977 | Smith | |
| 4,495,546 A * | 1/1985 | Nakamura | .......... H01L 23/5387 257/E23.177 |
| 4,712,160 A | 12/1987 | Sato et al. | |
| 4,788,626 A | 11/1988 | Neidig et al. | |
| 4,893,227 A | 1/1990 | Gallios et al. | |
| 4,899,256 A | 2/1990 | Sway-Tin | |
| 4,901,069 A | 2/1990 | Veneruso | |
| 4,975,821 A | 12/1990 | Lethellier | |
| 5,101,322 A | 3/1992 | Ghaem et al. | |

(Continued)

*Primary Examiner* — Paul D Kim
(74) *Attorney, Agent, or Firm* — Harverstock & Owens LLP

(57) ABSTRACT

A driving board folding machine comprises a machine housing, a movable table and one or more pre-folding stations for holding an unfolded flexible circuit and a circuit housing. When the driving board folding machine is activated, the one or more pre-folding stations are moved to a folding station located within the machine housing and the flexible circuit is folded and inserted within the circuit housing. The driving board folding station is able to comprise multiple pre-folding stations on one or more sides of the movable table. A holding pin holds the flexible circuit in place while a forming press moves in order to preform the flexible circuit, fold the flexible circuit and move the circuit housing to insert the flexible circuit into the housing.

13 Claims, 6 Drawing Sheets

(56) References Cited

U.S. PATENT DOCUMENTS

| | | |
|---|---|---|
| 5,144,742 A | 9/1992 | Lucas |
| 5,164,657 A | 11/1992 | Gulczynski |
| 5,204,806 A * | 4/1993 | Sasaki .................... H05K 1/189 |
| | | 361/749 |
| 5,235,491 A | 8/1993 | Weiss |
| 5,262,594 A | 11/1993 | Edwin |
| 5,262,932 A | 11/1993 | Stanley et al. |
| 5,295,044 A | 3/1994 | Araki et al. |
| 5,398,128 A | 3/1995 | Tajima |
| 5,490,052 A | 2/1996 | Yoshida et al. |
| 5,499,444 A | 3/1996 | Doane, Jr. |
| 5,565,761 A | 10/1996 | Hwang |
| 5,565,781 A | 10/1996 | Dauge |
| 5,592,128 A | 1/1997 | Hwang |
| 5,651,176 A * | 7/1997 | Ma ....................... H05K 13/028 |
| | | 198/763 |
| 5,712,772 A | 1/1998 | Telefus et al. |
| 5,742,151 A | 4/1998 | Hwang |
| 5,747,977 A | 5/1998 | Hwang |
| 5,798,635 A | 8/1998 | Hwang et al. |
| 5,804,950 A | 9/1998 | Hwang et al. |
| 5,811,895 A | 9/1998 | Suzuki et al. |
| 5,818,207 A | 10/1998 | Hwang |
| 5,870,294 A | 2/1999 | Cyr |
| 5,894,243 A | 4/1999 | Hwang |
| 5,903,138 A | 5/1999 | Hwang et al. |
| 5,905,369 A | 5/1999 | Ishii et al. |
| 5,923,543 A | 7/1999 | Choi |
| 5,997,983 A | 12/1999 | Caron |
| 6,031,730 A * | 2/2000 | Kroske .................. H05K 1/148 |
| | | 361/784 |
| 6,039,600 A * | 3/2000 | Etters ................... H01R 12/592 |
| | | 439/493 |
| 6,058,026 A | 5/2000 | Rozman |
| 6,069,803 A | 5/2000 | Cross |
| 6,077,124 A | 6/2000 | Etters et al. |
| 6,160,725 A | 12/2000 | Jansen |
| 6,272,015 B1 | 8/2001 | Mangtani |
| 6,282,092 B1 | 8/2001 | Okamoto et al. |
| 6,288,343 B1 | 9/2001 | Ahn |
| 6,344,980 B1 | 2/2002 | Hwang et al. |
| 6,358,064 B2 | 3/2002 | Szalay et al. |
| 6,396,277 B1 | 5/2002 | Fong et al. |
| 6,407,514 B1 | 6/2002 | Glaser et al. |
| 6,469,914 B1 | 10/2002 | Hwang et al. |
| 6,469,980 B1 | 10/2002 | Takemura et al. |
| 6,483,037 B1 | 11/2002 | Moore |
| 6,483,281 B2 | 11/2002 | Hwang |
| 6,605,930 B2 | 2/2003 | Hwang |
| 6,531,854 B2 | 3/2003 | Hwang |
| 6,541,944 B2 | 4/2003 | Hwang |
| 6,578,253 B1 | 6/2003 | Herbert |
| 6,657,417 B1 | 12/2003 | Hwang |
| 6,671,189 B2 | 12/2003 | Jansen et al. |
| 6,674,272 B2 | 1/2004 | Hwang |
| 6,711,024 B1 | 3/2004 | Johansson |
| 6,958,920 B2 | 10/2005 | Mednik et al. |
| 7,047,059 B2 | 5/2006 | Arvin et al. |
| 7,167,373 B1 * | 1/2007 | Hoang ................ H01L 23/3128 |
| | | 174/254 |
| 7,286,376 B2 | 10/2007 | Yang |
| 7,439,962 B2 | 10/2008 | Reynolds et al. |
| 7,998,065 B2 * | 8/2011 | Avni ...................... A61B 1/041 |
| | | 348/76 |
| 8,188,373 B2 | 5/2012 | Hunrath |
| 2002/0011823 A1 | 1/2002 | Lee |
| 2003/0035303 A1 | 2/2003 | Balakrishnan et al. |
| 2004/0192082 A1 | 9/2004 | Wagner |
| 2004/0228153 A1 | 11/2004 | Cao et al. |
| 2005/0105224 A1 | 5/2005 | Nishi |
| 2005/0281425 A1 | 12/2005 | Greuet et al. |
| 2006/0120059 A1 | 6/2006 | Farkas |
| 2007/0090894 A1 | 4/2007 | Phan |
| 2008/0047135 A1 | 2/2008 | Arnold |
| 2008/0289859 A1 | 11/2008 | Mikado |
| 2009/0317639 A1 | 12/2009 | Axisa |
| 2010/0012362 A1 | 1/2010 | Abe |
| 2011/0120754 A1 | 5/2011 | Kondo |
| 2013/0213695 A1 | 8/2013 | Lee |

* cited by examiner

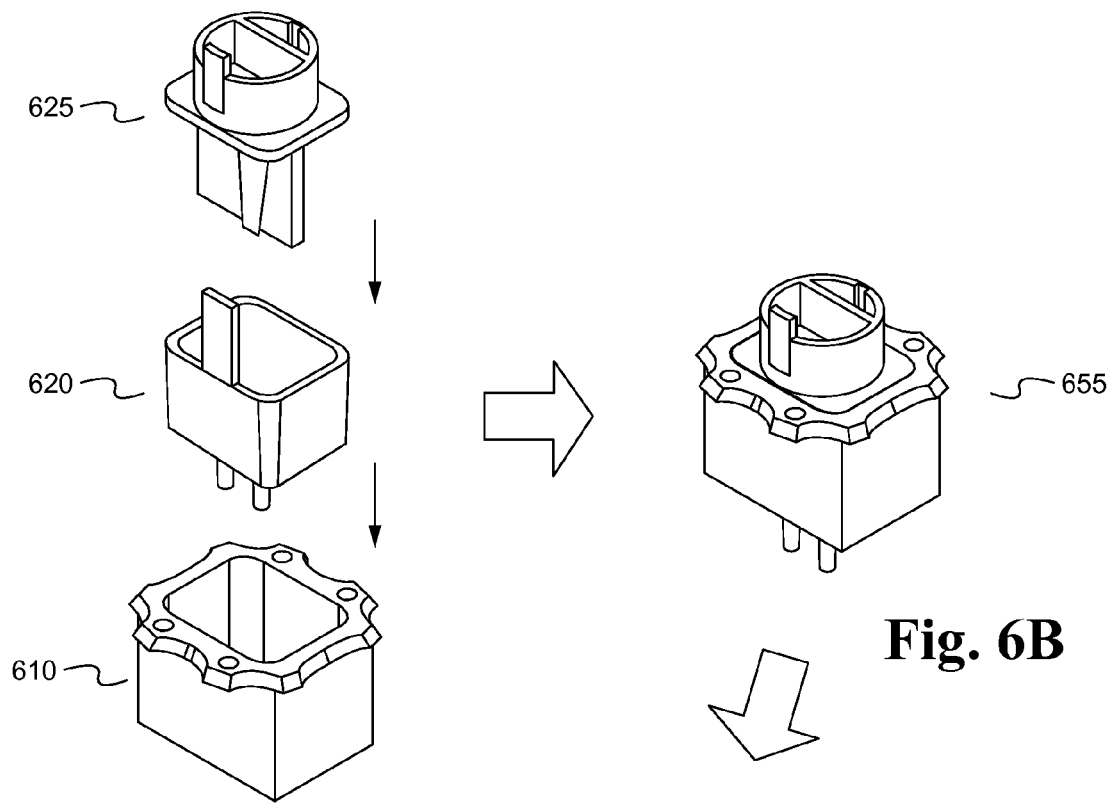
Fig. 6B
Fig. 6A
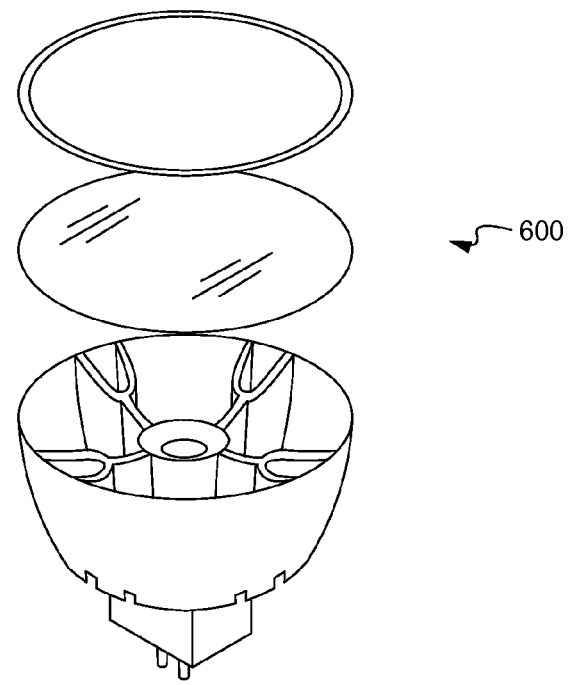
Fig. 6C

DRIVING BOARD FOLDING MACHINE AND METHOD OF USING A DRIVING BOARD FOLDING MACHINE TO FOLD A FLEXIBLE CIRCUIT

RELATED APPLICATIONS

This Patent Application claims priority under 35 U.S.C. 119(e) of U.S. provisional patent application, Application No. 61/732,812, filed on Dec. 3, 2012, and entitled "DRIVING BOARD FOLDING MACHINE," which is also hereby incorporated by reference in its entirety.

FIELD OF THE INVENTION

The present invention is generally directed to the field of flexible circuits. More specifically, the present invention is directed to an automated solution for folding a flexible circuit and inserting it into a circuit housing.

BACKGROUND OF THE INVENTION

Flexible circuits offer the same advantages as conventional printed circuit boards, including quality, reliability and high density. The flexible nature of the circuits enable them to assume three-dimensional configurations in order to save weight and space over conventional wiring. Particularly, the formability of a flexible circuit enables a package size reduction and allows the circuit to be folded into unique designs in order to solve interconnection problems. Consequently, flexible circuits find many uses, including automotive, aerospace, electronics and industrial applications. Additionally, because the flexible circuit is able to be folded to a desired configuration it may improve the internal appearance of the electronic package and increase the overall desirability of a product. Typically, such flexible circuits are folded and assembled within in a circuit housing by hand.

SUMMARY OF THE INVENTION

An automated driving board folding machine folds an unfolded flexible circuit and insert it into a circuit housing. A circuit housing and a folding circuit are loaded at one or more pre-folding stations of the machine. After the machine is activated, the flexible circuit and the circuit housing are moved to a folding station located within the machine housing where the flexible circuit is folded and inserted within the circuit housing. Tooling of the machine is able to hold the flexible circuit in place while the circuit is pre-formed and then inserted within the circuit housing.

In one aspect, a driving board folding machine comprises a machine housing, a movable table and one or more pre-folding stations for holding a circuit housing and an unfolded flexible circuit. When the machine is activated each pre-folding station is moved to a folding station located within the machine housing where the flexible circuit is folded and inserted into the circuit housing. In some embodiments, the one or more pre-folding stations are slidably inserted into the machine housing. In further embodiments, the movable table comprises a first end and second opposite the first end, and wherein each of the first end and the second end comprise one or more pre-folding stations. In some of these embodiments, the one or more pre-folding stations are rotatably inserted into the machine housing. In some embodiments, the flexible circuit is preformed before it is inserted into the circuit housing. In some embodiments, the flexible circuit is folded at a force less than 50N. In some embodiments, the flexible circuit comprises a circuit for a LED lamp.

In another aspect, a pre-folding station for a driving board folding machine comprises a circuit support coupled to a movable table and for receiving a flexible circuit and a circuit housing. In some embodiments, the circuit support comprises one or more apertures for receiving one or more circuit connector pins. In a further aspect, a folding station for a driving board folding machine comprises a holding pin, a forming press and an unfolded flexible circuit and a circuit housing held between the holding pin and the forming press. In some embodiments, the holding pin and the forming press are each actuated by a pneumatic cylinder. In some embodiments, the holding pin is configured to hold the flexible circuit in place while the forming press moves upward in order to fold the flexible circuit and insert is into the circuit housing. In some embodiments, the flexible circuit and the circuit housing are held by a circuit support. In further embodiments, the forming press is shaped in order to preform the flexible circuit before the flexible circuit is folded and inserted within the circuit housing. In some embodiments, the forming press is actuated at a force less than 50N. In some embodiments, the flexible circuit comprises a circuit for a LED lamp.

In still another aspect, a method of using a driving board folding machine to fold a flexible circuit and insert it within a circuit housing comprises coupling a circuit housing with a circuit support. An unfolded flexible circuit is placed on a top of the circuit support and the circuit housing. The machine is then activated. When the machine is activated, the flexible circuit and the circuit housing are moved to a folding station where the flexible circuit is folded and inserted into the circuit housing. In some embodiments, the flexible circuit and the circuit housing are rotated to the folding station where the flexible circuit is folded and inserted into the circuit housing. In further embodiments, the flexible circuit is held in place by a holding pin while a forming press moves in a direction in order to fold the flexible circuit and insert it into the circuit housing. In some embodiments, the flexible circuit is preformed before it is inserted in the circuit housing. In some embodiments, the flexible circuit comprises a circuit for a LED lamp.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIGS. 6A-6C illustrate a flexible circuit as folded and implemented within a LED lamp in accordance with some embodiments.

DETAILED DESCRIPTION OF THE EMBODIMENTS

Embodiments of the invention are directed to a driving board folding machine comprising a machine housing, a movable table and one or more pre-folding stations for holding an unfolded flexible circuit and a circuit housing. When the driving board folding machine is activated, the one or more pre-folding stations are moved to a folding station located within the machine housing and the flexible circuit is folded and inserted within the circuit housing. The driving board folding machine is able to comprise multiple pre-folding stations on one or more sides of the movable table. A holding pin holds the flexible circuit in place while a forming press moves in order to preform the flexible circuit and move the circuit housing to insert the flexible circuit into the housing.

Reference will now be made in detail to implementations of the driving board folding machine as illustrated in the accompanying drawings. The same reference indicators will be used throughout the drawings and the following detailed description to refer to the same or like parts. In the interest of clarity, not all of the routine features of the implementations described herein are shown and described. It will be appreciated that in the development of any such actual implementation, numerous implementation-specific decisions can be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
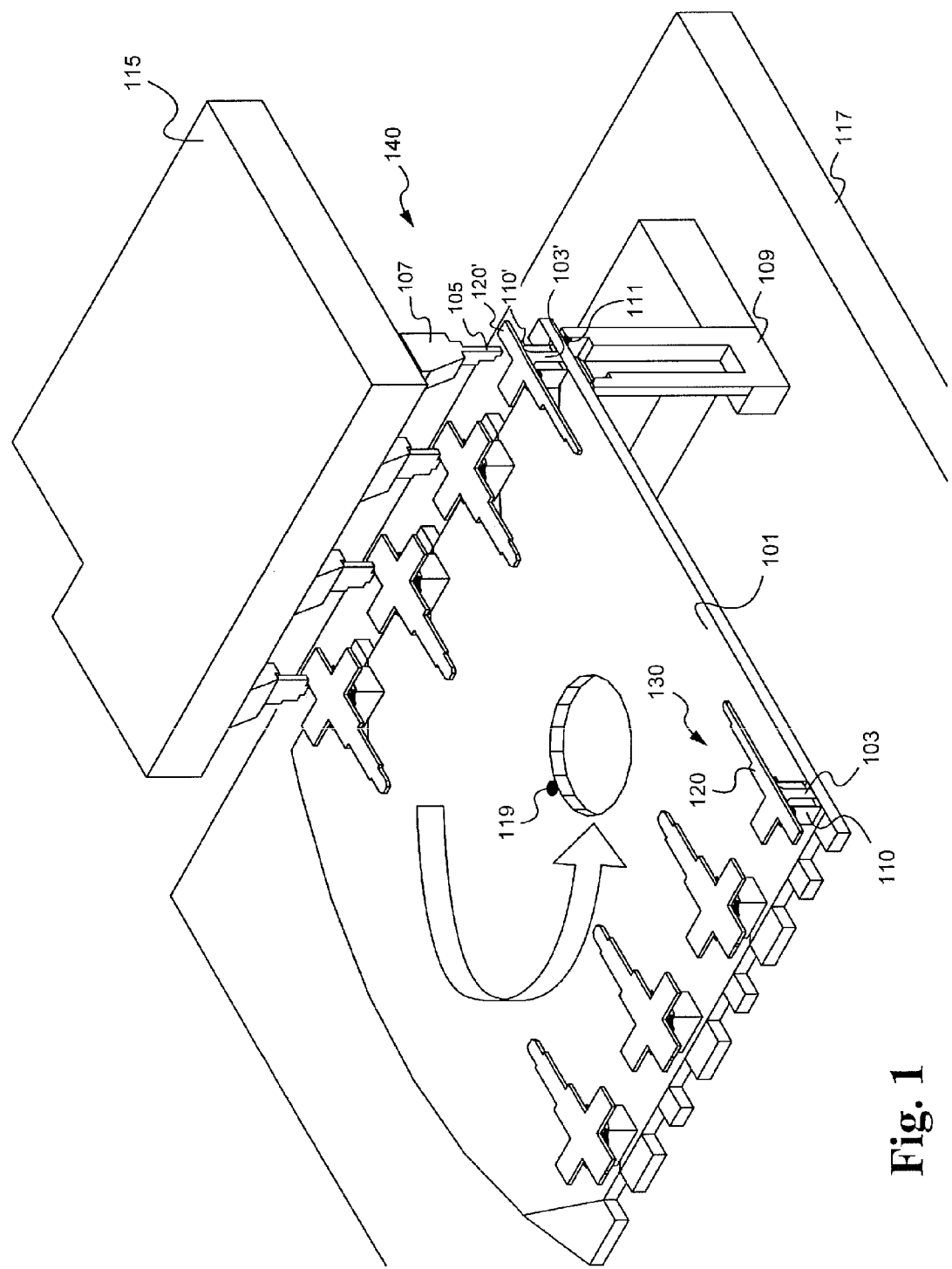
FIG. 1 illustrates a driving board folding machine in accordance with some embodiments.

Referring now to FIG. 1, a driving board folding machine is depicted therein. The driving board folding machine 100 comprises a machine housing 115, a movable table 101 and one or more pre-folding stations 130. Each pre-folding station 130 comprises a circuit support 103 for receiving a circuit housing 110 and an unfolded circuit 120. As shown in FIG. 1, the driving board folding machine 100 comprises three pre-folding stations 130. However, as will be apparent to someone of ordinary skill in the art, the machine 100 is able to comprise any number of pre-folding stations 130 as appropriately desired. When the machine 100 is activated, the one or more pre-folding stations 130 are moved to a folding station 140 within the machine housing 115 where the flexible circuit 120 is folded and inserted into the circuit housing 110. The machine housing 115, the movable table 101 and the one or more pre-folding stations 130 are coupled to a base 117 for supporting the driving board folding machine 100.

In some embodiments, the one or more pre-folding stations 130 are slid into the machine housing 115 by movement of the table 101. In some embodiments, the movable table 101 comprises a first end and a second end opposite the first end and the first end and the second end each comprise one or more pre-folding stations 130. In these embodiments, the one or more pre-folding stations 130 are rotatably inserted within the machine housing 115. As shown within FIG. 1, the movable table 101 is rotatable about a rotation pin 119. The one or more pre-folding stations 130 are able to be used in order to load a circuit housing 110 and an unfolded flexible circuit 120 before moving to a folding station 140 within the machine housing 115. As shown within FIG. 1, the housing 115 is open on the sides and top for exemplary purposes. However, the housing 115 is able to completely enclose the one or more folding stations 140.

The one or more folding stations 140 each comprises a holding pin 105 held in place by a holding pin support 107 and a forming press 109. The flexible circuit 120' and the circuit housing 110' are held by the circuit support 103' between the holding pin 105 and the forming press 109 before the flexible circuit 120' is folded and inserted into the housing 110'. The forming press 109 comprises a special shape 111 for preforming the circuit 120' before it is folded and inserted within the circuit housing 110'. When the movable table 101 is rotated so that the flexible circuit 120' and circuit housing 110' are supported between the holding pin 105 and the forming press 109, the holding pin 105 moves down to press the flexible circuit 120' and hold it in place. Then, the forming press 109 preforms the flexible circuit and moves the circuit housing 110 upwards and the flexible circuit 120' is folded and inserted into the circuit housing 110'. After the circuit 120' is folded and inserted within the circuit housing 110' the finished product is automatically moved from the machine housing 115 where it is able to be collected.

In some embodiments, the circuit 120' is folded at a force less than 50N so that the flexible circuit 120' is not damaged. In some embodiments, the flexible circuit 120 and the flexible circuit 120' comprise a circuit for a LED lamp. However any appropriately desired flexible circuit is able to be folded and inserted with the circuit housing.

Figure 2:
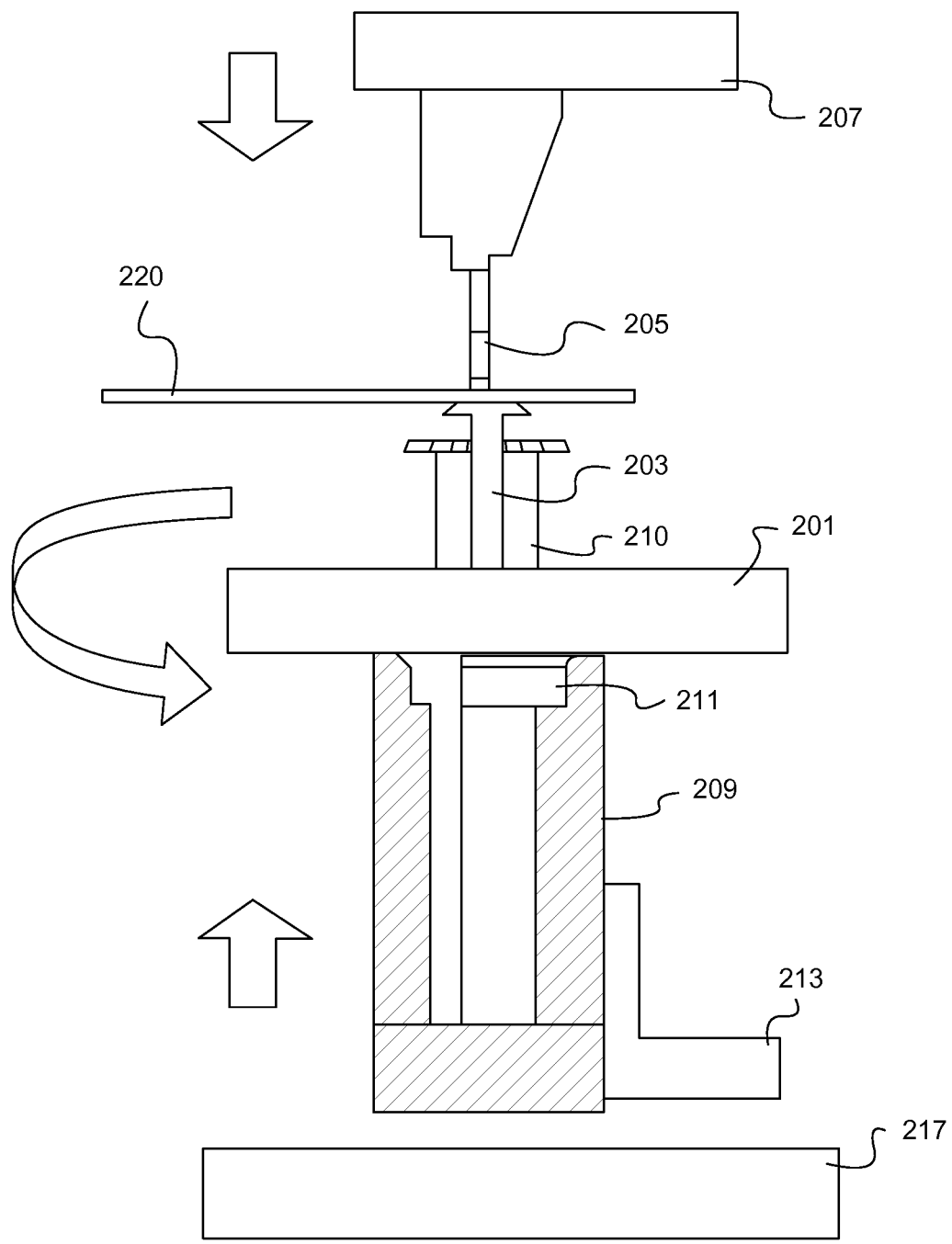
FIG. 2 illustrates a folding station for a driving board folding machine in accordance with some embodiments.

FIG. 2 illustrates a close-up view of a folding station for a driving board folding machine, such as described above. The folding station 240 comprises a holding pin 205 held in place by a holding pin support 207 and a forming press 209. A flexible circuit 220 and a circuit housing 210 are held between the holding pin 205 and the forming press 209. As shown within FIG. 2, the flexible circuit 220 and the circuit housing 210 are held by a circuit support 203 coupled to a movable table 201. The movable table 201 moves the flexible circuit 220 and the circuit housing 210 from the pre-folding station (130) to the folding station 240.

In some embodiments, the holding pin 205 and the forming press 209 are each actuated by a pneumatic cylinder. However, the holding pin 205 and the forming press 209 are able to be powered by any appropriate mechanism. During operation, the holding pin 205 is moved down by a pneumatic cylinder in order to press the flexible circuit 220 and hold it in place. The holding pin 205 moves down because it is convenient to place the flexible circuit 220 onto the circuit support 203 and be held in place by gravity. In some embodiments, the holding pin 205 can move horizontally or upward to press the flexible circuit 220 into place. The holding pin 205 is able to be specially shaped in order to avoid damage to the electrical components of the flexible circuit 220. Particularly, the holding pin 205 is able to be shaped in order to hold and protect a desired circuit 220 as it is folded and inserted into a housing 210. The pneumatic cylinder 213 moves the forming press 209 upward in order to preform the flexible circuit 220 as it is folded and inserted within the circuit housing 210. Although, the forming press 209 is shown as moving in an upward direction in order to fold the flexible circuit 220 and insert it within the housing 210, it is contemplated that the forming press 209 is able to be moved in a downward direction in order to fold the flexible circuit 220 and insert it within the housing 210.

As described above, in some embodiments, the circuit 220 is preferably folded at a force less than 50N so the flexible circuit 220 is not damaged. In some embodiments, the flexible circuit 220 comprises a circuit for a LED lamp, however any appropriately desired flexible circuit is able to be folded and inserted with the circuit housing.

Figure 3A:
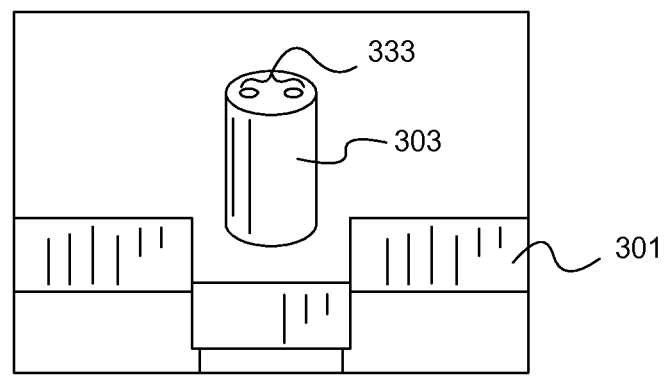
FIG. 3A illustrates a circuit support for a driving board folding machine in accordance with some embodiments.
Figure 3B:
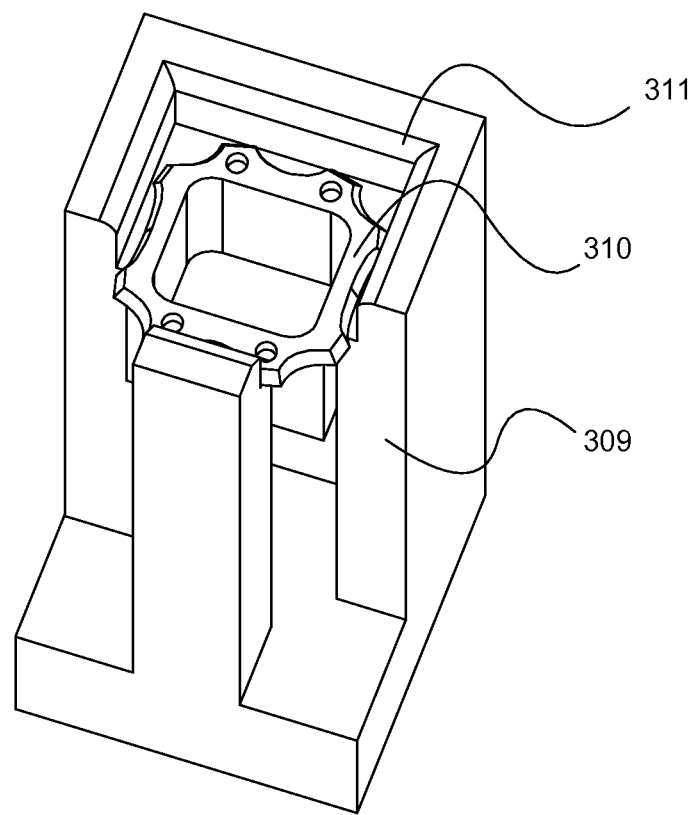
FIG. 3B illustrates a forming press for a driving board folding machine in accordance with some embodiments.

FIGS. 3A and 3B illustrate a close-up view of the forming press and the circuit support.

FIG. 3A illustrates a circuit support 303 coupled to a section of movable table 301. As shown in FIG. 3A, the circuit support 303 comprises one or more apertures 333 for receiving one or more connector pins of a circuit. The one or more apertures 333 enable the one or more connector pins to be pressed into the circuit support 303 in order to securely hold an unfolded flexible circuit and to avoid movements of the circuit during operation of the folding machine. The circuit support 303 is specially shaped in order to avoid damage to the electrical components of the flexible circuit when it is inserted into the housing. Particularly, the circuit support 303 is shaped in order to hold and protect a desired circuit as it is folded and inserted into a housing.

FIG. 3B illustrates a circuit housing inserted within a forming press 309. As described above, the forming press 309 is moved in order to preform an unfolded flexible circuit, fold the flexible circuit and insert the circuit within the circuit housing 310. The forming press 309 is formed with a special shape 311 at the top in order preform the flexible circuit before it is folded and inserted within the housing 310. The forming press 309 is able to formed in any appropriate shape in order to preform and fold a circuit depending on the desired folded shape and the shape of the circuit housing 310. As the forming press 309 presses the flexible circuit, the special shape 311 preforms the circuit as the forming press 309 moves the circuit housing 310 upwards in order to insert the flexible circuit within the circuit housing 310.

The driving board folding machine comprises a machine housing, a movable table, and a pre-folding station comprising a flexible circuit and circuit housing. The machine is activated in order to move the flexible circuit and the circuit housing into the machine housing where the flexible circuit is folded and inserted within the circuit housing. After the circuit is folded and inserted within the circuit housing, the finished product is automatically moved from the machine housing where it is able to be collected.

Figure 4:
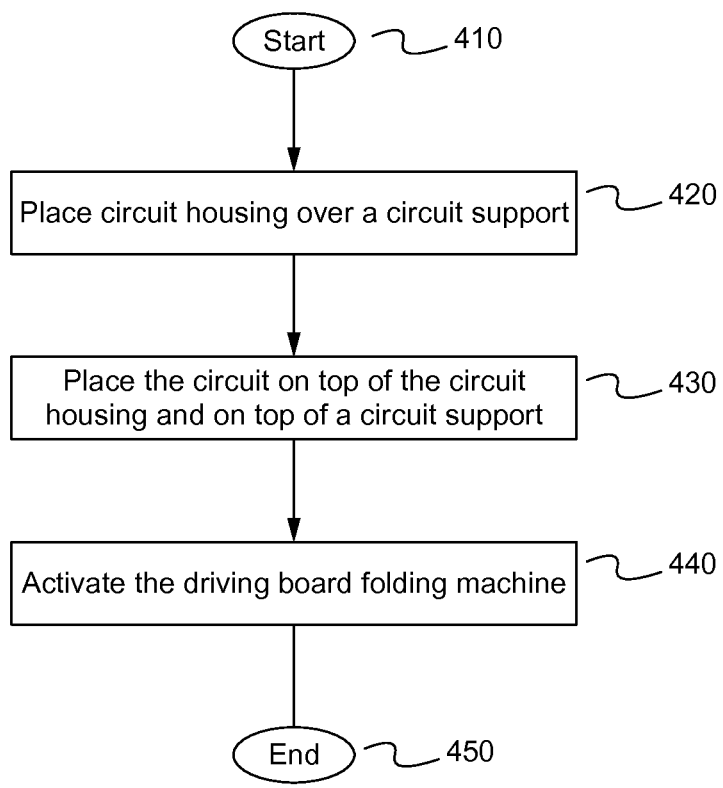
FIG. 4 illustrates an automated method for using a driving board folding machine for folding a flexible circuit and inserting it within a circuit housing in accordance with some embodiments.

FIG. 4 illustrates an automated method of using a driving board folding machine for folding a flexible circuit and inserting it within a circuit housing. The method begins in the step 410. In the step 420, a circuit housing is coupled to a circuit support. In some embodiments, this comprises placing the circuit housing over and around the circuit support. In the step 430, an unfolded flexible circuit is placed on a top of the circuit support and the circuit housing. In some embodiments, one or more connection pins of the flexible circuit are placed within one or more apertures on the top of the circuit support in order to firmly hold the flexible circuit in place. Then, in the step 440, the driving board folding machine is activated. When the machine is activated, the flexible circuit and the circuit housing are moved to a folding station where the flexible circuit is folded and inserted into the circuit housing. In some embodiments, the flexible circuit and the circuit housing are moved from a pre-folding station and to the folding station where the flexible circuit is folded and inserted into the circuit housing. In some embodiments, the flexible circuit and the circuit housing are rotated to the folding station. As described above, the flexible circuit is held in place while a forming press moves in order to preform the flexible circuit and then fold the flexible circuit and insert it within the circuit housing. In some embodiments, the flexible circuit comprises a circuit for a LED lamp. In some embodiments, a plurality of different flexible circuits are simultaneously folded and inserted into a plurality of different circuit housings. The finished product is automatically moved from the machine housing and is able to be collected. The method ends in the step 450.

Figure 5B:
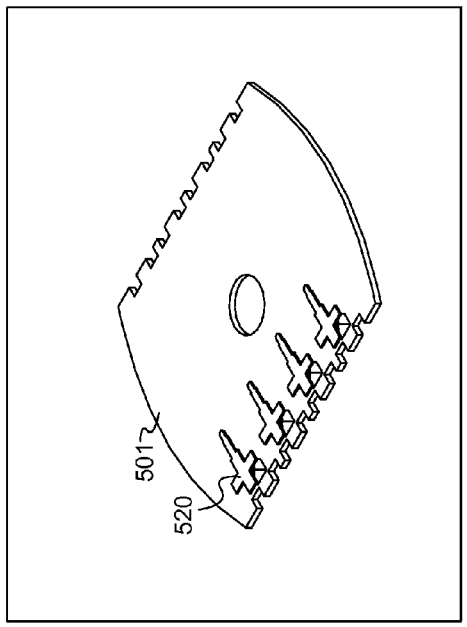
FIGS. 5A-5D illustrate a driving board folding machine in operation in accordance with some embodiments.
Figure 5D:
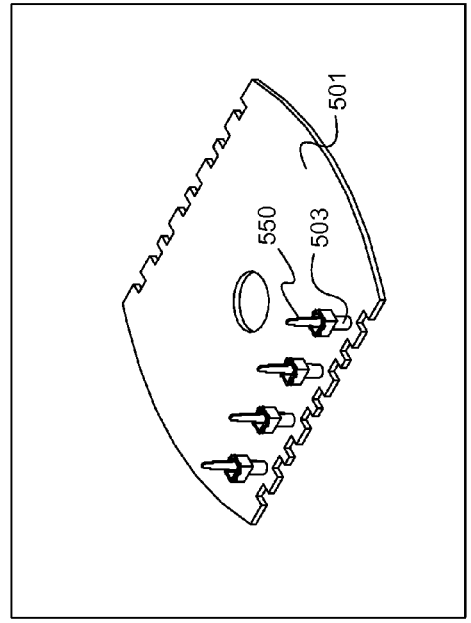
Figure 5A:
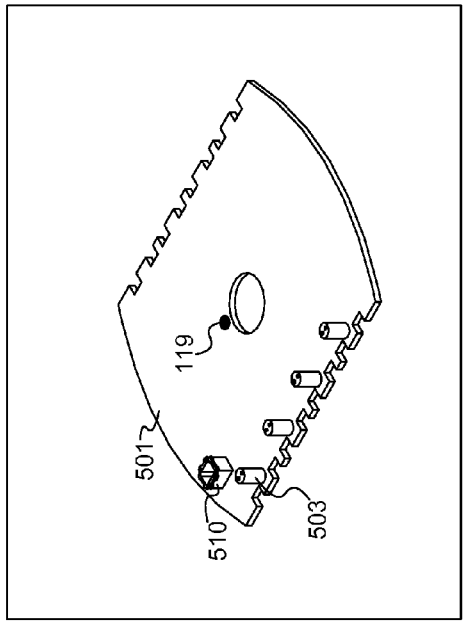
Figure 5C:
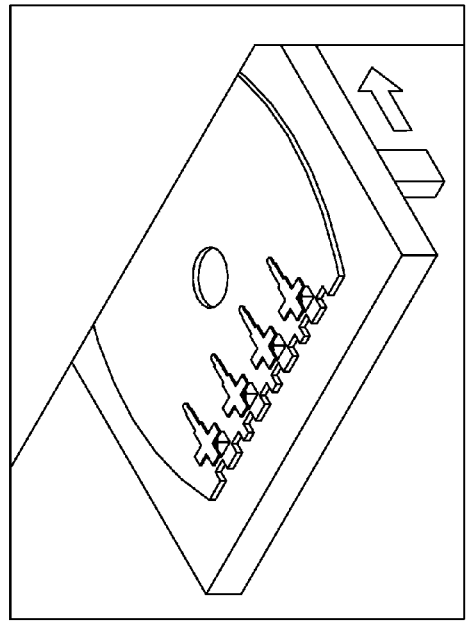

FIGS. 5A-5C illustrate a driving board operation machine in operation. As shown within FIGS. 5A and 5B, the circuit housing 510 and the flexible circuit 520 are coupled to the circuit support 503 at a pre-folding station. In some embodiments, a series of four flexible circuits and circuit housings are able to be loaded in approximately 25.4 seconds. In FIG. 5C the driving board machine has been activated so that the movable table 501 is rotated about the pivot pin 519 so that the flexible circuits and the circuit housings are moved into the machine housing to a folding station.

Once in the machine housing, the flexible circuits are folded and inserted within the circuit housings, such as described above. In some embodiments, the flexible circuits and circuit housings are able to be moved to the housing, folded and inserted within the circuit housings at a cycle time of approximately nine seconds. A finished circuit and circuit housing 550 is removed from the circuit support 603. In some embodiments, the series of four finished circuits and circuit housings are able to be unloaded in approximately 8.5 seconds. Particularly, in some embodiments, a driving board folding machine is able to fold and insert a series of four flexible circuits within the circuit housings in a cycle time of 42.9 seconds and fold and insert 334 flexible circuits per hour.

As shown in FIG. 6A, after a flexible circuit 620 is folded and inserted within a circuit housing 610 the finished product is able to be coupled with a circuit plug 625 to form a flexible circuit of a LED lamp 655 and coupled with a LED bulb to form the finished LED lamp 660. Although, the flexible circuit 620 is shown as compatible with a LED lamp, it is contemplated that the same method and device is able to be used for other flexible circuits and circuit housings as appropriately desired.

In operation, a driving board folding machine is able to fold a flexible circuit and insert the flexible circuit within a circuit housing. An unfolded flexible circuit and circuit housing are secured to a pre-folding station before the flexible circuit is folded and inserted within a circuit housing. After the device is activated the pre-folding station is moved to a folding station located within the machine housing and the flexible circuit is folded and inserted into the circuit housing.

Specifically, flexible circuit is able to be easily folded and inserted into a circuit housing using an automated process. Additionally, the machine is able to fold and insert multiple circuits during a single cycle. Consequently, multiple finished circuits are able to be created in a minimal amount of time. Moreover, because the process is automated there is little completion error and minimal difference in completed products. Particularly, the driving board folding machine creates and enables a complete mechanism that folds a flexible circuit and inserts it within the circuit housing upon activation. Accordingly, the driving board folding machine as described herein has many advantages.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention. Specifically it will be apparent to someone of ordinary skill in the art that the invention is able to be used to fold any appropriate flexible circuit and to insert the circuit within the circuit housing.

What is claimed is:

1. A driving board folding machine comprising:
   a. a machine housing;
   b. a movable table, wherein the movable table comprises a first end and second opposite the first end, and wherein each of the first end and the second end comprise one or more pre-folding stations;
   c. each of the one or more pre-folding stations for holding a circuit housing and an unfolded flexible circuit, wherein the one or more pre-folding stations are rotatably inserted into the machine housing; and
   d. an apparatus for moving each of the one or more pre-folding stations to a folding station located within the machine housing where the unfolded flexible circuit is folded and inserted into the circuit housing.

2. The driving board folding machine of claim 1 wherein the one or more pre-folding stations are slidably inserted into the machine housing.

3. The driving board folding machine of claim 1 wherein the flexible circuit is folded before the flexible circuit is inserted into the circuit housing.

4. The driving board folding machine of claim 1 wherein the unfolded flexible circuit is folded at a force less than 50N.

5. The driving board folding machine of claim 1 wherein the unfolded flexible circuit comprises a circuit for a LED lamp.

6. The driving board folding machine of claim 1 wherein the folding station includes a holding pin, a forming press, and a circuit support, wherein the circuit support is adapted to hold the unfolded flexible circuit between the holding pin and the forming press.

7. A pre-folding station for a driving board folding machine, the pre-folding station comprising:
   a. a circuit support coupled to and extends from a movable table and for receiving an unfolded flexible circuit and a circuit housing such that, when the unfolded flexible circuit and the circuit housing are received, the circuit housing surrounds the circuit support and the unfolded flexible circuit is positioned over a top of the circuit support and the circuit housing.

8. The pre-folding station of claim 7 wherein the circuit support comprises one or more apertures for receiving one or more circuit connector pins.

9. The pre-folding station of claim 7, wherein the circuit support includes at least one aperture formed on a top planar surface, wherein each of the at least one aperture formed on the top planer surface is configured to receive a connector pin of the flexible circuit when the flexible circuit is placed on top of the circuit support and the circuit housing.

10. A method of using a driving board folding machine to fold a flexible circuit and insert the flexible circuit within a circuit housing, the method comprising:
    a. coupling the circuit housing with a circuit support;
    b. placing an unfolded flexible circuit on a top of the circuit support and the circuit housing; and
    c. activating the machine,
wherein when the machine is activated, the unfolded flexible circuit and the circuit housing are moved and rotated to a folding station wherein the unfolded flexible circuit is folded and inserted into the circuit housing.

11. The method of claim 10 wherein the unfolded flexible circuit is held in place by a holding pin while a forming press moves upward in order to fold the unfolded flexible circuit and insert the flexible circuit into the circuit housing.

12. The method of claim 11 wherein the unfolded flexible circuit is folded before the flexible circuit is inserted in the circuit housing.

13. The method of claim 10 wherein the unfolded flexible circuit comprises a circuit for a LED lamp.

* * * * *